United States Patent

Ishikawa et al.

[11] Patent Number: 4,990,973
[45] Date of Patent: Feb. 5, 1991

[54] METHOD OF PRODUCING AN MMIC AND THE INTEGRATED CIRCUIT PRODUCED THEREBY

[75] Inventors: Takahide Ishikawa; Kazuhiko Nakahara, both of Itami, Japan

[73] Assignee: Mitsubishi Denki Kabushiki Kaisha, Tokyo, Japan

[21] Appl. No.: 436,615

[22] Filed: Nov. 15, 1989

Related U.S. Application Data

[62] Division of Ser. No. 289,210, Dec. 22, 1988, Pat. No. 4,921,814.

[30] Foreign Application Priority Data

Dec. 28, 1987 [JP] Japan .................. 62-335886

[51] Int. Cl.$^5$ .............................................. H01L 29/80
[52] U.S. Cl. ........................................ 357/22; 330/277; 330/296; 307/296.1; 357/51
[58] Field of Search .................. 357/22 H, 22 K, 22, 357/51, 55; 330/277, 296; 307/296.1, 304, 571

[56] References Cited

U.S. PATENT DOCUMENTS 4,686,387 8/1987 Rumelhard .................. 330/296

FOREIGN PATENT DOCUMENTS

| 0204387 | 12/1986 | European Pat. Off. | .......... 357/22 K |
| 55-95329 | 7/1980 | Japan | .......... 357/51 |
| 01117168 | 7/1984 | Japan | .......... 357/51 |
| 59-224175 | 12/1984 | Japan | .......... 357/22 K |
| 61-272964 | 12/1986 | Japan | . |
| 62-76681 | 4/1987 | Japan | . |
| 62-210663 | 9/1987 | Japan | .......... 357/51 |

OTHER PUBLICATIONS

Ch'en, MMIC's The Next Generation of Microwave Components, Microwave J. (U.S.A.), vol. 23, No. 5, May 1980, pp. 67–78.
Pengelly, Microwave Field-Effect Transistors-Theory, Design, and Application, 1982, pp. 381–399.

Primary Examiner—Andrew J. James
Assistant Examiner—Courtney A. Bowers
Attorney, Agent, or Firm—Leydig, Voit & Mayer

[57] ABSTRACT

A method of producing MMIC's and the MMIC thus produced having a reproducible quiescent operating point from lot to lot under the same bias conditions. The source to drain saturation current of the amplifier MESFET in the MMIC can vary from lot to lot if the depth of the gate recess varies from lot to lot. As a result, the quiescent operating point of the amplifier under the same bias conditions can vary from lot to lot. A compensated gate bias source, preferably in the form of an extra MESFET on the MMIC, is fabricated at the same time as the amplifier MESFET and thus has a gate recess having a depth which precisely matches that of the amplifier MESFET. The extra MESFET is connected as a compensated gate bias source and has a resistance which is a function of the depth of the gate recess and thus compensates the quiescent operating point of the amplifier MESFET.

4 Claims, 4 Drawing Sheets

METHOD OF PRODUCING AN MMIC AND THE INTEGRATED CIRCUIT PRODUCED THEREBY

This is a division of application Ser. No. 289,210, filed Dec. 22, 1988, U.S. Pat. No. 4,921,814.

FIELD OF THE INVENTION

This invention relates to MMIC's, and more particularly to a method for producing MMIC amplifiers having characteristics which are consistent from lot to lot.

BACKGROUND OF THE INVENTION

The development of monolithic microwave integrated circuits (MMIC's) has allowed superior performance at frequencies higher than non-integrated amplifiers of the past. Enhanced frequency response is provided in part by use of III-V semiconductor materials, and in part by the fact of integration on a single chip and the short very direct interconnections that allows. Integration, however, also presents some difficulties in that the opportunity to adjust discrete components to achieve a desired operating point is curtailed. As a result, it is sometimes difficult to accommodate for differences in operating characteristics caused by minor process variations which can occur over time from lot to lot.

One such problem can be illustrated with reference to FIG. 1 which shows a chip pattern for a typical prior art one-stage negative feedback amplifier and FIG. 2 which shows the circuit diagram for that amplifier. As shown in FIG. 1, an amplifier MESFET 11 is formed on a substrate 12 of semi-insulator material such as GaAs. It is seen that other elements of the amplifier are formed on the same substrate and metallized interconnections 20 are used to provide short and direct low inductance connections between such elements. External terminals 13a-17a are also provided for interconnecting the integrated circuit with the external world including inputs, outputs and bias power supplies. Metallic (e.g., gold) connecting wires 18 interconnect the external terminals 13a-17a with internal electrode pads 13b-17b and thus the integrated circuit elements.

As is well known in the art, the MESFET 11 includes source and drain regions interconnected by a channel. Formed on the source and drain regions are ohmic source S and drain D electrodes. A gate electrode G overlies the channel and as will be described below is formed in a gate recess.

In greater detail, the source S of the MESFET is grounded while the drain D is connected to the output terminal 17a and, via a diffusion resistor $R_L$, to a drain bias voltage source $V_{DD}$. The gate G has four connections: to ground via a diffusion resistor $R_B$ and a first capacitive element $C_1$, to a gate bias voltage source $V_B$ via the same diffusion resistor $R_B$, to an input terminal via a second capacitive element $C_2$, and to the drain D via a feedback network comprising a resistor R and a third capacitive element $C_3$.

A portion of the MESFET 11 is shown in cross section in FIG. 3a. It is seen that the substrate 12 includes a doped region 19 forming an active layer. Typically, the doped region 19 is formed by masking followed by ion implantation, usually with silicon ions implanted into the semi-insulative substrate. The doped region 19 typically extends to about 0.3 to 0.7 microns into the substrate and is formed to include a heavily doped source region 19a, a similarly heavily doped drain region 20a connected by a more lightly doped channel 22. Source S and drain D ohmic electrodes are formed on the respective source and drain regions. The partly completed device is then masked and etched to form a gate recess 21 crossing the channel 22 and located intermediate the source and drain. The recess forms a thinned cross sectional area of the channel which improves threshold voltage control while allowing the rest of the channel to remain thick to minimize parasitic resistance. Conventionally, the depth dr of the channel 21 is approximately 0.2 to 0.4 microns. Following etching, a Schottky metal gate G is formed in the recess 21 by conventional plating and liftoff techniques.

FIG. 3b is similar to FIG. 3a and serves to illustrate the problems which can arise from inadequate control of the etching process for forming the gate recess 21. As is appreciated, the wet etching process used to form the gate recess 21 is not always as controllable as desired. For example, the composition of the etching liquid may vary slightly from day to day, resulting in a differences in etching conditions from day to day. Similarly, the etching speed may vary due to slight temperature variations over time. Thus, the amount of etching (i.e., the depth dr of the gate recesses) may vary for devices produced on different wafers or lots. As shown in FIG. 3a, the $dr_1$ of the recess is less than the value $dr_2$ of the recess for the device of FIG. 3b. As a result, the cross sectional area of the channel under the gate G of FIG. 3a is greater than the cross sectional area of the same region for the device of FIG. 3b which results in undesirable differences in device characteristics from lot to lot.

As is known in the art, FET saturation current $I_{DSS}$ is dependent on (i.e., is proportional to) the cross sectional area of the channel 22 through which carriers (in this case electrons) flow from source to drain. When the depth dr of the recess 21 is large, the cross section of the channel 22 is small causing the device to saturate at a lower current level. Similarly, when the depth dr of the recess 22 is small, the cross sectional area of the channel 22 increases, increasing the saturation current level. The relationship between channel cross section (or recess depth) and saturation current $I_{DSS}$ for the devices of FIGS. 3a and 3b is shown in FIGS. 4a and 4b, respectively.

More particularly, FIGS. 4a and 4b show the DC characteristics for the FET's of FIGS. 3a and 3b, respectively, connected in the amplifier circuit of FIG. 2. The drain to source saturation current, that is, the maximum current through the device for a given drain bias $V_{DD}$ and load resistance $R_L$ with zero volts gate bias is seen to differ as a function of changes in the recess depth (or channel cross sectional area). When the recess depth is shallow as in FIG. 3a, creating a channel of large cross section, the saturation current $I_{DSS1}$ is relatively higher than the saturation current $I_{DSS2}$ for the device of FIG. 3b under the same operating conditions.

As a result, the quiescent operating points $Q_1$, $Q_2$ for a given gate bias ($-V_{GG}$) are different and the amplifiers will perform in a different way for the same bias conditions. More particularly, as seen in FIG. 4a, the FIG. 3a amplifier will have a quiescent operating point $Q_1$ of $V_{Q1}$ at current $I_{Q1}$ whereas the FIG. 3b amplifier will have a quiescent operating $Q_2$ at a lower quiescent operating current $I_{Q2}$ and a higher quiescent operating voltage $V_{Q2}$ as illustrated in FIG. 4b. The undesirability of such variations in operating characteristics from lot to lot will be readily apparent.

SUMMARY OF THE INVENTION

In view of the foregoing, it is a primary object of the present invention to provide an MMIC having an amplifier whose quiescent operating point is the same from lot to lot regardless of differences in the saturation current level of the amplifier MESFET.

It is a more detailed object to provide such an MMIC in which the quiescent operating point is automatically adjusted to accommodate for changes in the saturation current level.

Another object of the present invention is to provide a method for producing such an MMIC which does not substantially increase the cost or complexity of the fabrication process.

Other objections and advantages will become apparent from the following detailed description.

In accordance with the invention, there is provided a method of producing a plurality of MMIC's each having a MESFET amplifier with a reproducible quiescent operating point from lot to lot under the same bias conditions. In addition to creating a doped region for forming the amplifier MESFET, the invention contemplates forming a second doped region for a second and additional MESFET. After the active regions are doped and the source and drain electrodes are in place on the two MESFET's, a gate recess is etched over the channel of each MESFET. The etching is accomplished at the same time such that the recesses for the two MESFET's are of precisely the same depth. After forming gate electrodes, the devices are interconnected such that the extra MESFET is connected as a compensated gate bias source in the gate circuit of the amplifier MESFET to produce an improved MMIC. Since the depths of the gate recesses, when they vary from lot to lot, will remain the same for the amplifier MESFET and its compensated gate bias source, the MMIC's thus produced will have quiescent operating points for the amplifiers from lot to lot which will remain the same irrespective of differences in the source to drain saturation current.

DETAILED DESCRIPTION OF THE PREFERRED EMBODIMENTS

While the invention will be described in connection with certain preferred embodiments, there is no intent to limit it to those embodiments. On the contrary, the intent is to cover all alternatives, modifications and equivalents included within the spirit and scope of the invention as defined by the appended claims.

Figure 5:
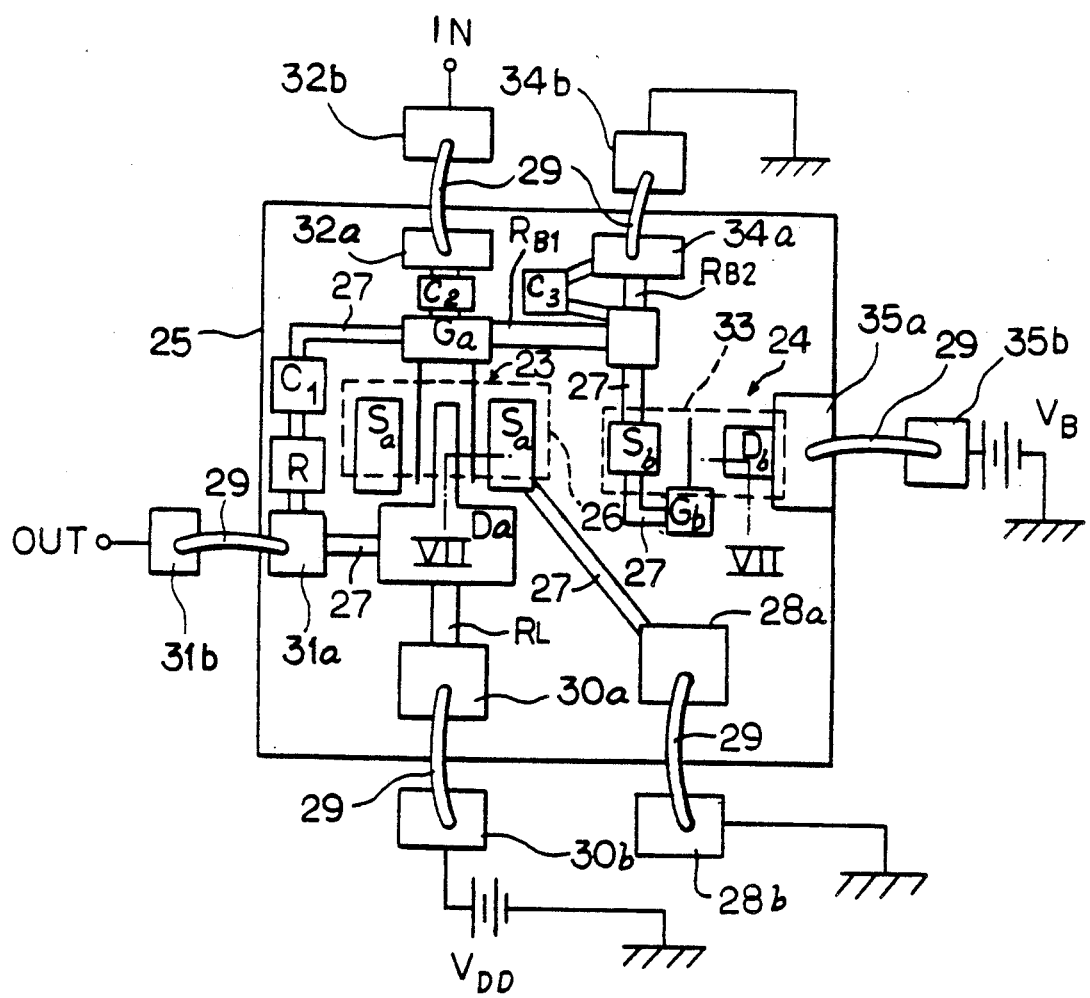
FIG. 5 is a perspective view of an MMIC chip pattern comprising a first embodiment of the present invention.
Figure 6:
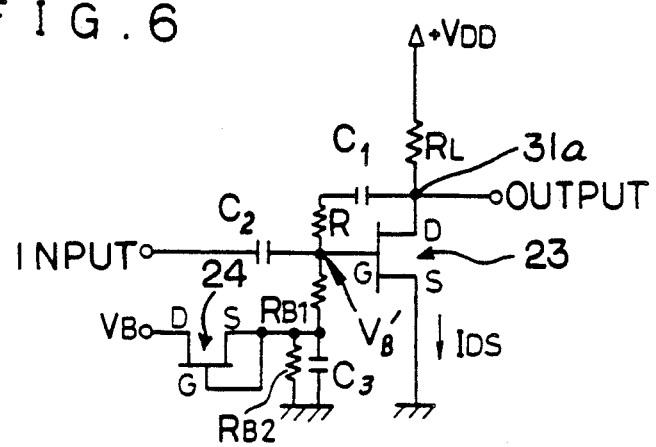
FIG. 6 is a circuit diagram of the MMIC of FIG. 5.

Referring now to FIGS. 5 and 6, there is shown the chip pattern and circuit diagram respectively of an MMIC constructed in accordance with an embodiment of the present invention. The circuit includes an amplifier MESFET 23 formed in a semi-insulative substrate 25 as will be described in greater detail below. In addition to the amplifier MESFET 23, and in accordance with the present invention, an additional MESFET 24 is provided, is formed at the same time as the amplifier MESFET 23 and is connected as shown in FIG. 6 as a compensated gate bias source for the amplifier MESFET 23.

Figure 7A:
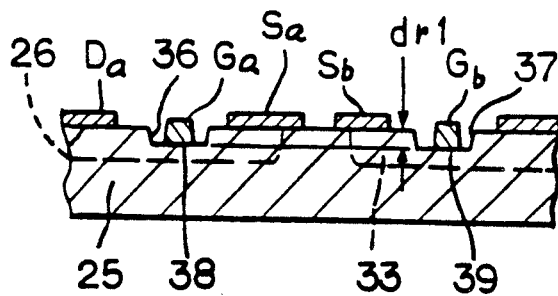
FIGS. 7(a) and 7(b) are cross-sectional views of two embodiments of the present invention along the line VII—VII of FIG. 5.

In greater detail, the MMIC elements illustrated in FIG. 5 including MESFET's, diffusion resistances, capacitors, metallic bonding pads and the like are formed using techniques typically employed in MMIC fabrication. Those techniques will not be described in detail here except where they are modified in accordance with the practice of the invention. It is seen that the amplifier MESFET 23, which includes heavily doped source and drain regions connected by a more lightly doped channel is identifiable in FIG. 5 by the ohmic source electrode $S_a$, the ohmic drain electrode $D_a$ and the connecting pad $G_a$ which is in turn connected to the Schottky barrier gate electrodes better illustrated in FIG. 7. The source electrode $S_a$ is grounded via a plated connector wire 27, an internal electrode pad 28a, a metallic (e.g., gold) connecting wire 29 and an external terminal 28b. The drain electrode $D_a$ is coupled to a drain bias voltage source $V_{DD}$ via a diffusion resistor $R_L$, internal and external electrodes 30a, 30b, and a connecting wire 29. Also, the drain is connected to an output terminal via electrodes 31a, 31b. The gate electrode $G_a$ has three connections: to the source electrode $S_b$ of the bias FET 24 via a diffusion resistor $R_{B1}$, to the drain electrode $D_a$ of the amplifier FET 23 via a feedback network comprising a first capacitive element $C_1$ and a resistor R, and to an input terminal via a second capacitive element $C_2$ and internal and external pads 32a, 32b.

The bias MESFET 24 is similarly constructed and like the amplifier MESFET 23 can be identified in FIG. 5 by its source and drain ohmic electrodes $S_b$, $D_b$ and the contact $G_b$ associated with the recessed Schottky gate electrode. The source $S_b$ of the bias FET 24 is coupled to the gate $G_a$ of the amplifier FET 23 via a diffusion resistor $R_{B1}$, as well as to ground via internal and external pads 34a, 34b and a parallel RC circuit comprising a diffusion resistor $R_{B2}$ and a capacitive element $C_3$. The drain electrode $D_b$ is coupled via internal and external pads 35a, 35b to a gate bias voltage source $V_B$. Finally, the gate $G_b$ is connected to the source electrode $S_b$ of the bias FET 24 such that the FET will function as a resistor.

In accordance with the present invention, and in order to compensate for the inconsistencies which are sometimes introduced into the conventional wet etching process by which the gate recess 36 (see FIG. 7) is produced over the channel of the amplifier FET 23, the bias FET 24 is produced on the GaAs substrate 25 in close proximity to the amplifier FET 23, has its gate recess etched at the same time as that of the amplifier FET 23, and is coupled thereto as a compensated gate bias source. More specifically, impurities, typically silicon, are selectively ion implanted into two adjacent regions on the surface of the semi-insulative GaAs substrate 25, thereby producing respective n-type active regions 26, 33 for the amplifier FET 23 and the bias FET 24. Source and drain electrodes are produced in a conventional manner on the respective source and drain regions of active layers 26, 33 of the GaAs substrate 25. Thereafter, portions of the surfaces, i.e., narrow recesses which span the channels of the respective MESFET's are simultaneously selectively wet etched to form recesses 36, 37. Since the wet etching of both recesses occurs simultaneously and for an equal duration, the depth dr of the recess 36 for the amplifier FET 23 is precisely equal to the depth dr of the recess 37 for the bias FET 24.

Upon completion of the wet etching process, Schottky metal gates $G_a$, $G_b$ are produced by conventional techniques in the respective recesses 36, 37, and the electrodes of both FETs are then connected to ground and other internal or external elements as described in detail above. Importantly, the compensated gate bias source MESFET 24 is connected in a voltage divider with resistance $R_{B2}$ in the bias circuit (i.e., between the bias source $V_B$ and ground). Since the gate and source of the MESFET 24 are connected to each other, the MESFET acts as a resistance and the voltage at the junction between the MESFET and resistance $R_{B2}$ is established voltage divider fashion and applied by way of resistance $R_{B1}$ to the gate of the amplifier MESFET 23.

As discussed previously, the saturation source-drain current $I_{DSS}$ for the amplifier FET 23 varies in proportion to the cross-sectional area of the active channel 38 underlying the gate recess 36. Thus, when no bias voltage ($V_B=0$) is applied to the gate electrode $G_a$ of the amplifier FET 23, the saturation current $I_{DSS}$ is higher when the depth dr of the gate recess 36 is small (see FIGS. 7(a), 7(b), 8(a) and 8(b) where $I_{DSS1} > I_{DSS2}$ since $dr_1 < dr_2$).

Figure 1:
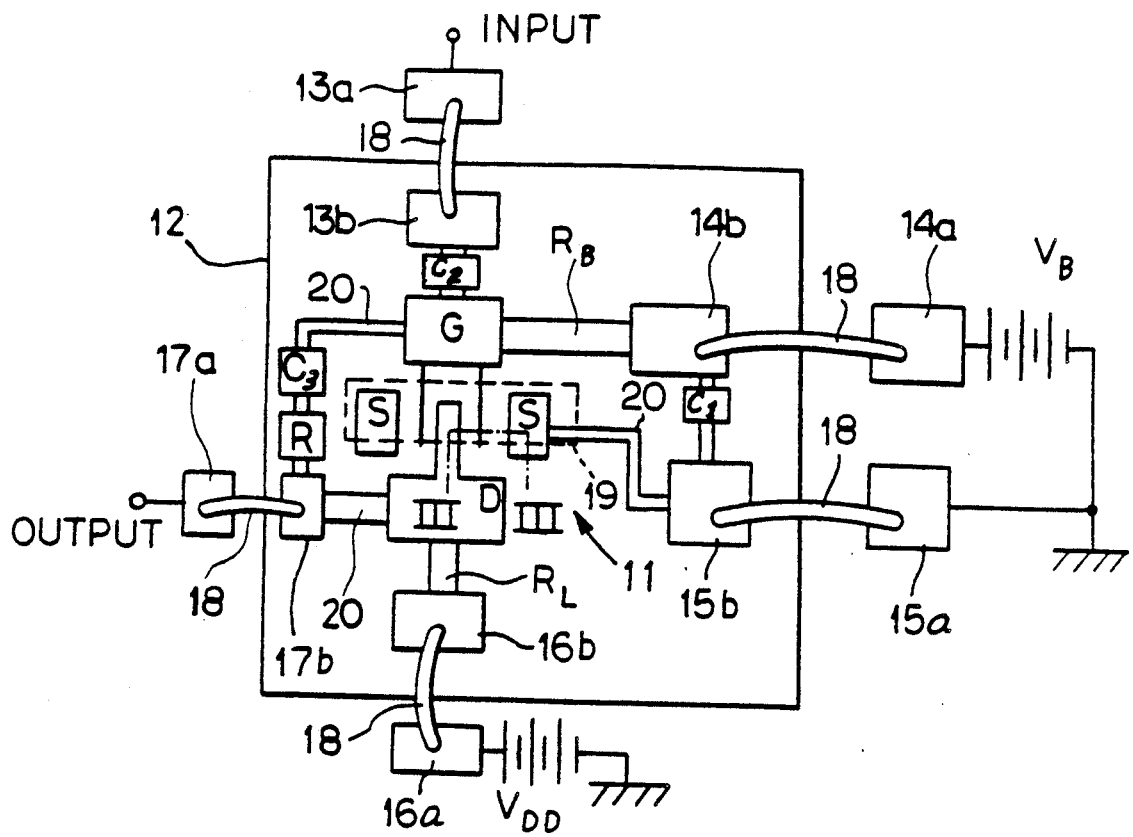
FIG. 1 is a perspective view of a chip pattern of a prior art one stage negative feedback amplifier.
Figure 2:
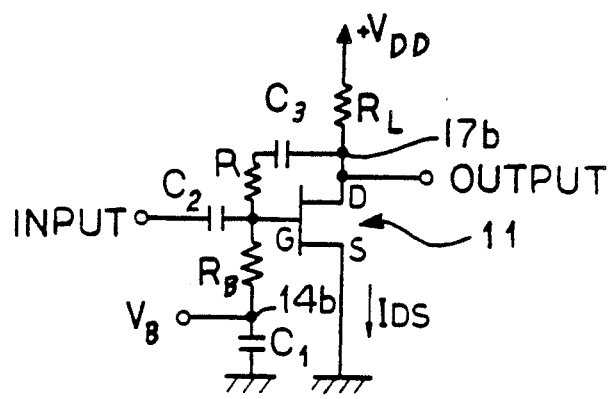
FIG. 2 is a circuit diagram of the prior art amplifier of FIG. 1.
Figure 3A:
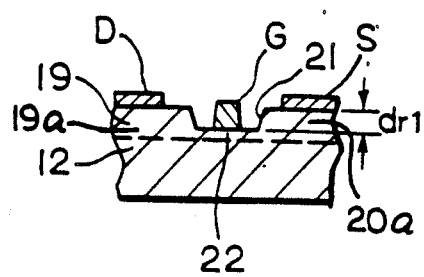
FIGS. 3(a) and 3(b) are cross-sectional views of two embodiments of the MESFET of the prior art amplifier, taken along the line III—III of FIG. 1.
Figure 3B:
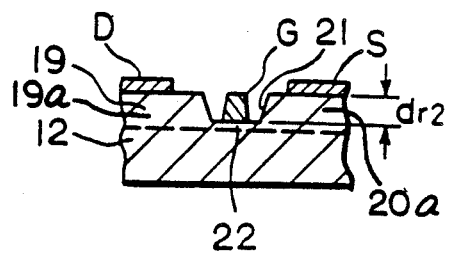
Figure 4A:
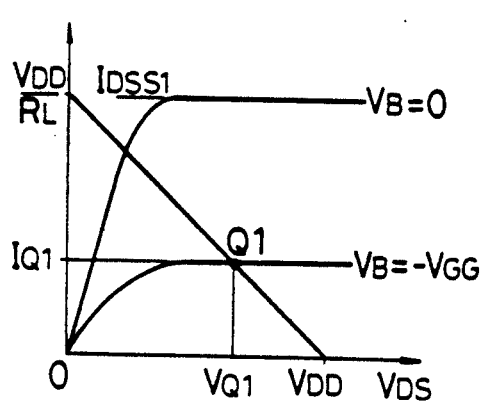
FIGS. 4(a) and 4(b) are graphs showing the DC characteristics of the prior art amplifiers of FIGS. 3(a) and 3(b), respectively.
Figure 4B:
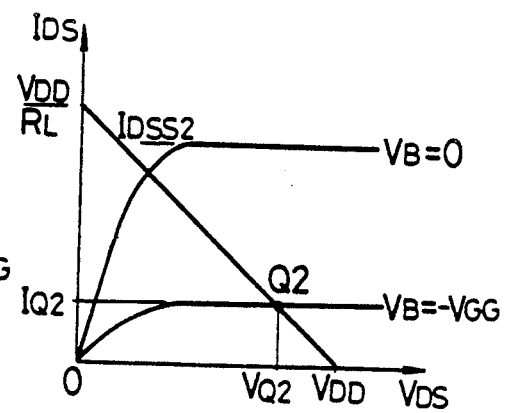

Accordingly, if the depth of the gate recess 36 of the amplifier FET 23 is less than a predetermined desired depth, the saturation current $I_{DSS}$ is higher than desired. Consequently, if the predetermined bias voltage $V_B$ ($=-V_{GG}$) were applied directly to the gate $G_a$ of the amplifier FET 23 (as was done in the prior art device of FIGS. 1 and 2), the quiescent source-drain current $I_Q$ would be higher than desired and the quiescent voltage $V_Q$ would be lower than desired.

However, in accordance with the present invention, the predetermined bias voltage $V_B$ ($=-V_{GG}$) is connected to the gate $G_a$ of the amplifier FET 23 via the compensating bias FET 24. The bias FET's recess 37 has a precisely equal depth dr (i.e., shallower than desired) as the recess of the amplifier FET 23, so that the resistance of the bias FET 24 is lower than normal. Consequently, because of the voltage divider action between FET 24 and $R_{B2}$ the bias voltage $V_B$, provided to the gate $G_a$ of the amplifier FET 23 becomes more negative, reducing the source-drain current $I_{DS}$ so that the quiescent operating point $Q_1$ is reduced to its desired level.

Figure 7B:
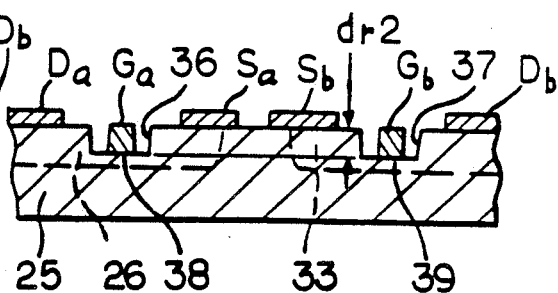
Figure 8A:
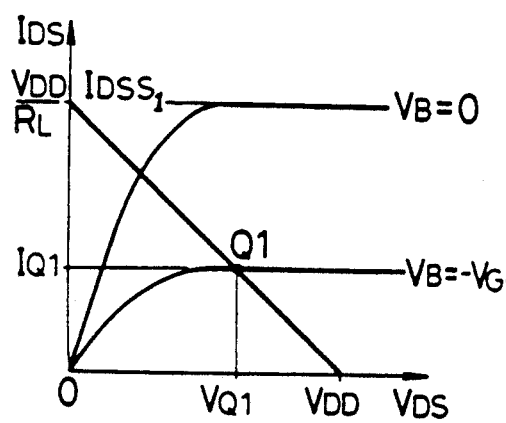
FIGS. 8(a) and 8(b) are graphs showing the DC characteristics of the MESFET's of the circuits of FIGS. 7(a) and 7(b), respectively.
Figure 8B:
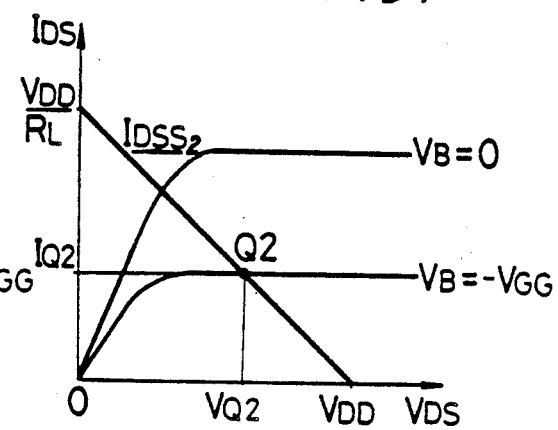

On the other hand, when the recess 36 of the amplifier FET 23 is etched too deep ($dr_2$ in FIG. 7(b)), the recess 37 of the bias FET 24 is also etched deeper to an equal extent. Accordingly, the resistance of the compensated bias FET 24 is higher than its normal level, and by way of the voltage divider action between it and $R_{B2}$ the bias voltage $V_B$, for the amplifier FET is made less negative, raising the quiescent operating point $Q_2$ of the amplifier FET to its normal level.

Therefore, in accordance with the present invention, for a predetermined gate bias voltage $V_B$ and a predetermined drain bias voltage $V_{DD}$ and load resistance $R_L$, the quiescent operating point Q of the amplifier FET 23 has the same value regardless of the depth dr of the gate recess 36 or the value of the saturation source-drain current $I_{DSS}$ because the compensating bias FET 24 has a precisely matched gate recess 37. Accordingly, it is possible to produce a plurality of MMIC's with a reproducible bias point from lot to lot under the same bias conditions irrespective of differences caused by slight variations in the etching conditions for the gate recess. Furthermore, it is possible to produce such MMIC's economically since such production requires only the introduction of one additional MESFET in the MMIC and that MESFET is fabricated with the same process steps used to fabricate the amplifier MESFET.

Figure 9:
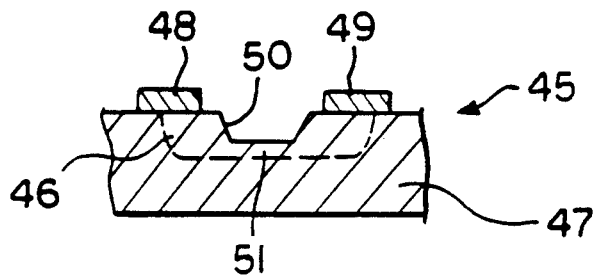
FIG. 9 is a cross-sectional view showing the construction of a diffusion resistance as a compensated bias resistance of an alternative embodiment of the present invention.

Turning now to FIG. 9, there is shown an alternative embodiment of a compensated bias source which, although it achieves certain of the advantages of the preferred embodiment described above, is a less preferred alternative. FIG. 9 illustrates a diffusion resistance 45 having a doped region 46 comprising implanted impurities such as silicon forming a diffusion channel 51. A pair of ohmic electrodes 48, 49 are disposed at either end of the channel and are deposited by conventional techniques such as vapor plating and liftoff. The diffusion resistance 45 is connected in the circuit of FIG. 6 in place of the MESFET 24.

Importantly, after the diffusion resistance is formed, it is masked and etched along with the amplifier MESFET 23 to produce a groove 50 over the channel 51. Thus, the diffusion resistance is trimmed while the MESFET gate recess is etched. Therefore, if the MESFET gate recess is etched more deeply than intended, the diffusion resistance 45 is trimmed to a higher than normal value (by virtue of the greater depth of recess 50). The result of raising the resistance of the diffusion resistor (connected in voltage divider fashion in the gate bias circuit) tends to compensate the gate bias by making it less negative, thereby increasing the operating point $Q_1$ of the amplifier MESFET 23 to its desired level. Similarly, when etching of a particular lot produces gate recesses which are slightly shallower than desired, the fact of trimming the bias resistor at the same time makes its channel 51 shallower than normal, reducing the value of the resistor, rendering the bias voltage more negative, and thereby reducing the operating point of the amplifier MESFET to its desired level.

As can be seen from the foregoing detailed description, the present invention provides a method of producing improved MMIC's whose amplifier MESFET quiescent operating points are identical regardless of the saturation currents and/or the depths of the gate recesses for those MESFETs. This method may be carried out very economically, and yet provides reproducible, highly reliable integrated circuit devices.

What is claimed is:

1. An MMIC comprising:
   a semi-insulative substrate, a first doped region in the substrate comprising an amplifier MESFET having source and drain regions connected by a channel, a second doped region comprising a diffusion resistance having at least a doped channel and located in the substrate near the amplifier MESFET, simultaneously etched recesses crossing each of the channels of precisely the same depth, a gate electrode in the recess of the amplifier MESFET, and means interconnecting the diffusion resistance with the gate electrode in voltage divider fashion connected to increase gate bias with increasing levels of amplifier MESFET saturation current and decrease gate bias with decreasing levels of amplifier MESFET saturation current, thereby to compensate for changes in saturation current level of the amplifier MESFET caused by variations in depth of the gate recess.

2. The MMIC of claim 1 wherein the diffusion resistance comprises a second MESFET having a source and drain connected by a channel, a gate recess for the second MESFET etched simultaneously with the gate recess for the amplifier MESFET to render said recesses of the same depth, a gate electrode in the recess of the second MESFET, and means interconnecting the source and the gate electrode of the second MESFET to render the second MESFET a compensated gate bias source having a resistance which varies inversely with the source to drain saturation current of the amplifier MESFET.

3. The MMIC of claim 2 wherein the semi-insulative substrate is GaAs, and the doped regions comprise silicon ions implanted in the substrate.

4. The MMIC of claim 2 wherein the channels of the respective MESFET's have cross sectional channel areas which are dependent on the depths of the respective recesses, the cross sectional channel area of the amplifier MESFET determining the saturation current of the amplifier, and the cross sectional channel area of the second MESFET determining the resistance of the compensated gate bias source.

* * * * *